(12) United States Patent
Hirose

(10) Patent No.: US 10,566,560 B2
(45) Date of Patent: *Feb. 18, 2020

(54) IMAGE PICKUP DEVICE AND ELECTRONIC APPARATUS

(71) Applicant: SONY SEMICONDUCTOR SOLUTIONS CORPORATION, Kanagawa (JP)

(72) Inventor: Yohei Hirose, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/039,994

(22) Filed: Jul. 19, 2018

(65) Prior Publication Data

US 2018/0323391 A1 Nov. 8, 2018

Related U.S. Application Data

(63) Continuation of application No. 15/273,518, filed on Sep. 22, 2016, now Pat. No. 10,056,570, which is a continuation of application No. 14/942,715, filed on Nov. 16, 2015, now Pat. No. 9,455,413, which is a continuation of application No. 14/313,488, filed on Jun. 24, 2014, now Pat. No. 9,224,789.

(30) Foreign Application Priority Data

Jul. 1, 2013 (JP) ................................. 2013-138262

(51) Int. Cl.
*H01L 51/44* (2006.01)
*H01L 27/30* (2006.01)

(52) U.S. Cl.
CPC .......... *H01L 51/445* (2013.01); *H01L 27/307* (2013.01); *H01L 51/441* (2013.01); *H01L 51/448* (2013.01); *H01L 2251/301* (2013.01); *H01L 2251/303* (2013.01); *Y02E 10/549* (2013.01)

(58) Field of Classification Search
CPC ... H01L 51/445; H01L 51/441; H01L 51/448; H01L 27/307; H01L 2251/303; H01L 2251/301; Y02P 70/521; Y02E 10/549
See application file for complete search history.

(56) References Cited

U.S. PATENT DOCUMENTS 9,224,789 B2* 12/2015 Hirose .................. H01L 27/307
2001/0048080 A1* 12/2001 Meulenbrugge ........ G01T 1/026
250/370.11

FOREIGN PATENT DOCUMENTS

CN 101300690 11/2008
JP 2013-123000 6/2013

OTHER PUBLICATIONS

Official Action (with English translation) for Chinese Patent Application No. 201410286186.1, dated Oct. 12, 2018, 26 pages.

* cited by examiner

Primary Examiner — John P. Dulka
(74) Attorney, Agent, or Firm — Sheridan Ross P.C.

(57) ABSTRACT

An image pickup device includes: a first electrode film; an organic photoelectric conversion film; a second electrode film; and a metal wiring film electrically connected to the second electrode film, the first electrode film, the organic photoelectric conversion film, and the second electrode film all provided on a substrate in this order, and the metal wiring film coating an entire side of the organic photoelectric conversion film.

9 Claims, 27 Drawing Sheets

IMAGE PICKUP DEVICE AND ELECTRONIC APPARATUS

CROSS REFERENCE TO RELATED APPLICATIONS

This application is a continuation of U.S. patent application Ser. No. 15/273,518, filed Sep. 22, 2016, which is a continuation of U.S. patent application Ser. No. 14/942,715, filed Nov. 16, 2015, now U.S. Pat. No. 9,455,413, issued Sep. 27, 2016, which is a continuation of U.S. patent application Ser. No. 14/313,488, filed Jun. 24, 2014, now U.S. Pat. No. 9,224,789, issued Dec. 29, 2015, which claims the benefit of Japanese Priority Patent Application JP2013-138262 filed Jul. 1, 2013, the entire disclosures of which are hereby incorporated herein by reference.

BACKGROUND

The present technology relates to an image pickup device, and an electronic apparatus equipped with the image pickup device.

Currently, image pickup devices, such as complementary metal oxide semiconductor (CMOS) image sensors and charge coupled devices (CCDs), are widely applied to digital still cameras, digital video cameras, and other similar apparatuses. Such image pickup devices include, in each pixel, for example, a photoelectric conversion film that acquires a photoelectric conversion signal, and a signal read circuit that reads the photoelectric conversion signal and outputs it to the outside. This photoelectric conversion film may be made of, for example, an organic material (e.g., refer to Japanese Unexamined Patent Application Publication No. 2013-55252).

SUMMARY

Organic materials tend to be deteriorated easily by moisture or gas. So, if the photoelectric conversion film is made of an organic material, it is necessary to suppress moisture and gas from entering this photoelectric conversion film. In some related techniques, a photoelectric conversion film is covered with a protective film that contains, for example, silicon nitride as its main ingredient, so that an entry of moisture and gas to the photoelectric conversion film is suppressed. Nevertheless, only covering a photoelectric conversion film with a protective film still has difficulty sufficiently suppressing moisture and gas from entering it. This is because pinholes may be created in the protective film or its step may be cracked, and an entry of moisture or gas through these pinholes or cracks could cause deterioration of the photoelectric conversion film. Furthermore, the photoelectric conversion film sustains etching damage in the manufacturing process, and therefore may be deteriorated. In short, photoelectric conversion films tend to be deteriorated easily by various incidents. Therefore, there is a necessity to suppress deterioration of photoelectric conversion films.

It is desirable to provide an image pickup device that is capable of suppressing deterioration of a photoelectric conversion film, and an electronic apparatus equipped with the image pickup device.

An image pickup device according to an embodiment of the present technology includes: a first electrode film; an organic photoelectric conversion film; a second electrode film; and a metal wiring film electrically connected to the second electrode film. The first electrode film, the organic photoelectric conversion film, and the second electrode film are all provided on a substrate in this order. The metal wiring film coats an entire side of the organic photoelectric conversion film.

An electronic apparatus according to an embodiment of the present technology includes: an image pickup device; and a signal processing circuit subjecting a pixel signal output from the image pickup device to a predetermined process, the image pickup device including a first electrode film, an organic photoelectric conversion film, and a second electrode film which are all provided on a substrate in this order, and a metal wiring film electrically connected to the second electrode film, the metal wiring film coating an entire side of the organic photoelectric conversion film.

According to the image pickup device and electronic apparatus in the embodiment of the present technology, the metal wiring film that is electrically connected to the second electrode film coats the entire side of the organic photoelectric conversion film. The metal wiring film used to drive the image pickup device thereby suppresses moisture and gas from entering the interior of the organic photoelectric conversion film through the side of the organic photoelectric conversion film. Consequently, according to the embodiment of the present technology, the metal wiring film is used for not only a voltage application path for the second electrode film, but also the protection of the organic photoelectric conversion film.

According to the image pickup device and electronic apparatus in the embodiment of the present technology, the metal wiring film used to drive the image pickup device suppresses moisture and gas from entering the interior of the organic photoelectric conversion film through the side of the organic photoelectric conversion film. It is thus possible to suppress deterioration of the photoelectric conversion film.

Moreover, according to the image pickup device and electronic apparatus in the embodiment of the present technology, if a protective film is provided between the organic photoelectric conversion film and the metal wiring film so as to coat both the organic photoelectric conversion film and the second electrode film, it is possible to use this protective film to mitigate etching damage to the organic photoelectric conversion film during manufacturing processing of the image pickup device. It is thus also possible to suppress deterioration of the photoelectric conversion film.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments and modifications of the present disclosure will be described in detail below with reference to the accompanying drawings. Note that the description will be given in the following order.

1. First embodiment (image pickup device)

an example in which a metal wiring film is provided with a single opening

2. Modifications (image pickup device)

First modification: an example in which a metal wiring layer is provided with openings in respective pixels Second modification: an example in which organic photoelectric conversion films in pixels are separated from one another Third embodiment: an example in which a protective film is provided on a transparent electrode Fourth modification: an example in which an optical black region is provided Fifth modification: an example in which an anti-flare film is provided Sixth modification: an example in which a passivation film is provided 3. Second embodiment (image pickup module)

4. Third embodiment (electronic apparatus)

1. First Embodiment (Configuration)

Figure 1:
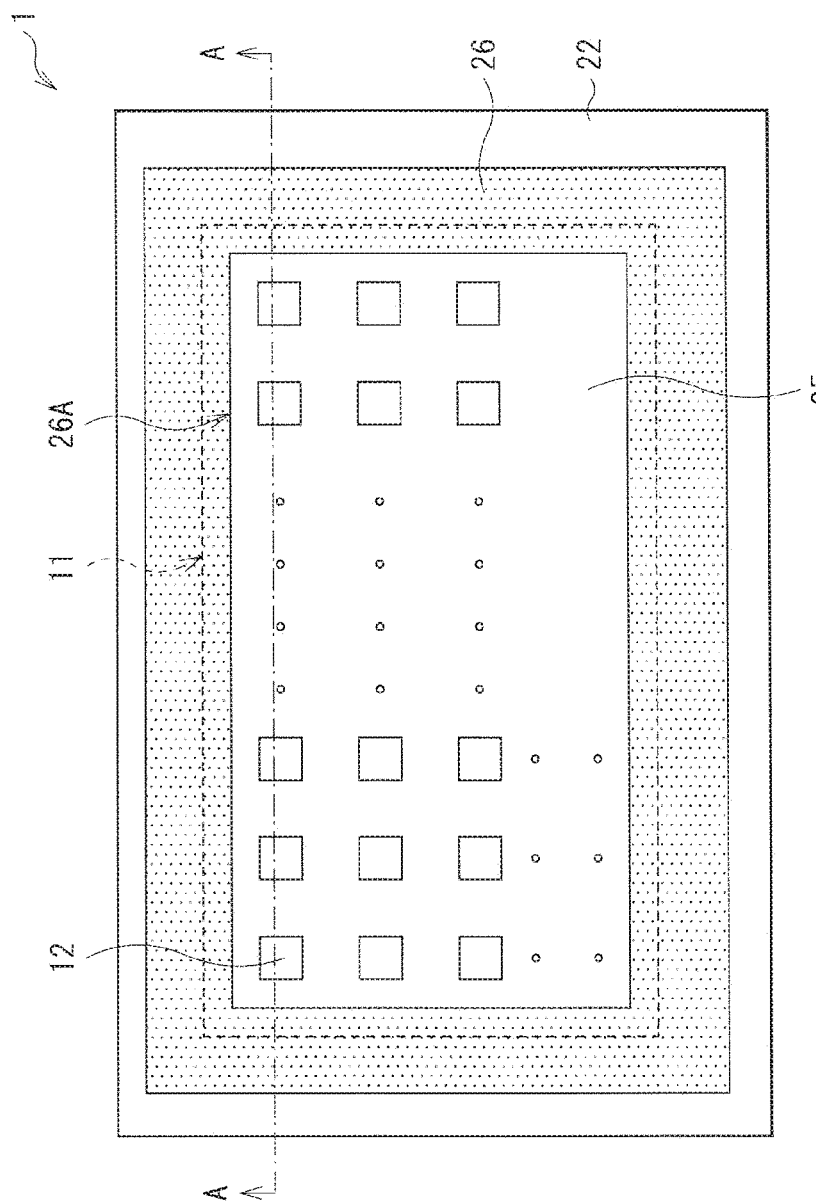
FIG. 1 is a view showing a upper-surface configuration example of an image pickup device according to a first embodiment of the present technology.
Figure 2:
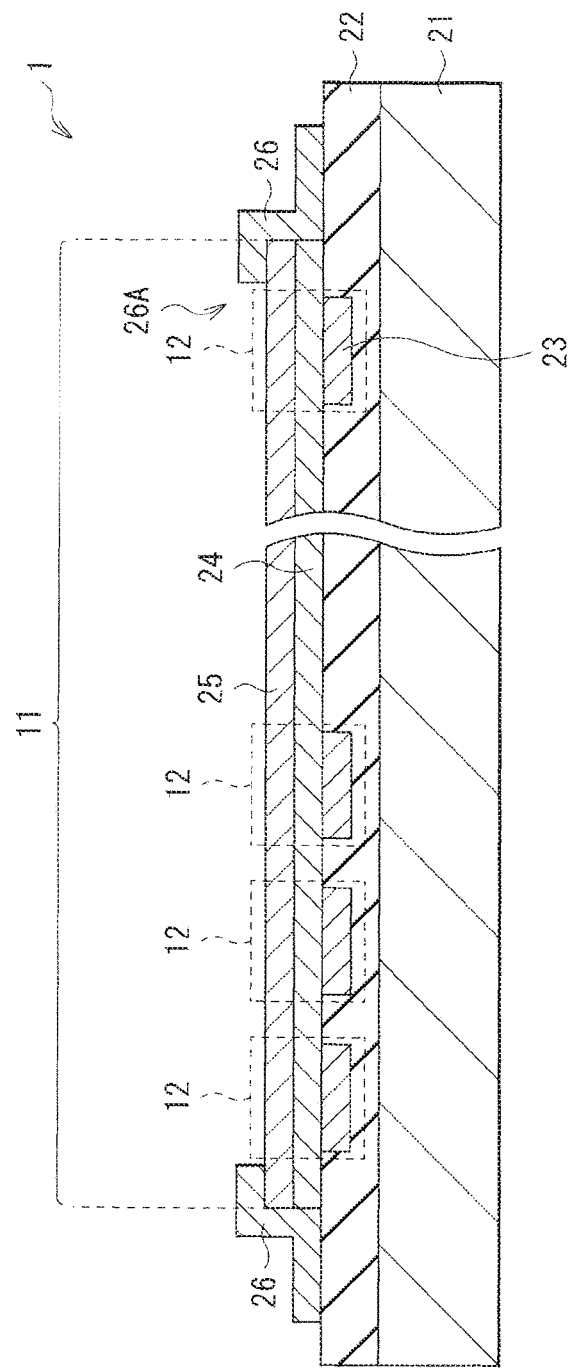
FIG. 2 is a view showing a cross-sectional configuration example as viewed from a direction of an A-A arrow in FIG. 1.

FIG. 1 shows a upper-surface configuration example of an image pickup device 1 according to a first embodiment of the present technology; FIG. 2 shows a cross-sectional configuration example as viewed from a direction of an A-A arrow in FIG. 1. The image pickup device 1 includes, for example, a pixel region 11 in which a plurality of pixels 12 are arranged in a matrix fashion. In addition, the image pickup device 1 includes, for example, a drive circuit that drives the pixels 12, and a transfer circuit that transfers electrical charge generated in each pixel 12 driven by the drive circuit. Furthermore, the image pickup device includes, for example, a read circuit that temporarily builds up the electrical charge transferred by the transfer circuit, and that outputs a pixel signal having a voltage according to the level of the build-up charge.

The image pickup device 1 includes, for example, an insulating film 22, lower electrode films 23, an organic photoelectric conversion film 24, an upper electrode film 25, and a metal wiring film 26 on a substrate 21. The lower electrode films 23, the organic photoelectric conversion film 24, and the upper electrode film 25 are disposed within the pixel region 11 and stacked on the substrate 21 in this order. Each lower electrode film 23 and respective parts of the organic photoelectric conversion film 24 and the upper electrode film 25 which face each lower electrode film 23 configure the pixel 12. The organic photoelectric conversion film 24 is sandwiched between the lower electrode film 23 and the upper electrode film 25 in each pixel 12.

The substrate 21 may be, for example, a semiconductor substrate or an insulating substrate. Examples of the semiconductor substrate may include a silicon substrate and a silicon-on-insulator (SOI) substrate. The silicon substrate or SOI substrate may be provided with a photodiode region. The insulating film 22 electrically separates the lower electrode films 23 from one another. The insulating film 22 is made of an insulating material that does not transmit moisture and gas easily. Examples of the insulating film 22 may include a silicon nitride film, a silicon nitrogen oxide film, an aluminum oxide film, and a stacked layer containing two or more of these films.

The lower electrode films 23 are disposed on the substrate 21 with the insulating film 22 therebetween. In addition, the lower electrode films 23 are arranged away from one another, and electrically separated from one another by the insulating film 22. Each lower electrode film 23 is an island-shaped film provided in the corresponding pixel 12, and functions as a pixel electrode. The lower electrode films 23 are arranged under the organic photoelectric conversion film 24, and are not disposed outside a region facing the organic photoelectric conversion film 24. The organic photoelectric conversion film 24 converts light with a preset wavelength band into electricity, and contains an organic material. The organic photoelectric conversion film 24 is a sheet-shaped film provided so as to be shared by all the pixels 12, and formed in the whole of the pixel region 11.

The upper electrode film 25 is disposed at least an area directly above the organic photoelectric conversion film 24. The upper electrode film 25 is a sheet-shaped film provided so as to be shared by all the pixels 12, and formed in the whole of the pixel region 11. If the upper electrode film 25 is formed only the area directly above the organic photoelectric conversion film 24, the side of the upper electrode film 25 is disposed on the organic photoelectric conversion film 24. If the upper electrode film 25 is formed so as to coat the organic photoelectric conversion film 24, the side of the upper electrode film 25 is disposed on the insulating film 22. The upper electrode film 25 is spatially isolated from the electrode films 23 by the insulating film 22.

The upper electrode film 25 is made of an electrically conductive and optically transmissive material. This conductive, transmissive material may be, for example, a metal containing one of Mg, Ag, Al, Cu, and Au or an alloy containing two or more thereof. In addition, one or both of Ca and Li may be added to the above metal or alloy for the conductive, transmissive material. Alternatively, the conductive, transmissive material may be, for example, ITO or IZO. The above conductive, transmissive material may be any material that transmits light with the wavelength band which the organic photoelectric conversion film 24 is able to convert into electricity.

The metal wiring film 26 is in contact with the upper electrode film 25, and electrically connected to the upper electrode film 25. In addition, the metal wiring film 26 coats both the entire sides of the organic photoelectric conversion film 24 and the upper electrode film 25. Here, the expression "coating both the entire sides of the organic photoelectric conversion film 24 and the upper electrode film 25" refers to seamlessly covering both the outer sides of the organic photoelectric conversion film 24 and the upper electrode film 25 as viewed from a direction of a normal to the substrate 21. In the first embodiment, the metal wiring film 26 is positioned opposite both the sides of the organic photoelectric conversion film 24 and the upper electrode film 25, as well as the periphery of the upper surface of the upper electrode film 25. The periphery of the metal wiring film 26 is formed on the insulating film 22. The metal wiring film 26 is spatially separated from the lower electrode films 23 by the insulating film 22.

The metal wiring film 26 is formed so as to avoid a region in the pixel region 11 that faces the pixels 12 used to receive light. The metal wiring film 26 may be, for example, a circular film that has a single opening 26A in a region that faces all the pixels 12 used to receive light, as shown in FIGS. 1 and 2. All the pixels 12 used to receive light may be, for example, accordingly exposed through the opening 26A. The metal wiring film 26 is made of a metal material that does not transmit moisture and gas easily. The metal wiring film 26 may be made of, for example, W, Al, Ti, Mo, Ta, Cu, an alloy containing one thereof, or a material containing one thereof and Si.

The image pickup device 1 may be provided with a passivation film on its entire upper surface including the upper surface of the upper electrode film 25, as necessary. This passivation film protects the pixels 12, and may be made of, for example, a silicon nitride film, a silicon nitrogen oxide film, an aluminum oxide film, or a stacked film containing two or more thereof. The image pickup device 1 may be provided with a color filter instead of or together with the passivation film. The color filter is positioned opposite the pixels 12, and selectively transmits part of externally incident light which lies within a desired wavelength band. If the image pickup device 1 is provided with the protective film, such as the passivation film or color filter, on the upper surface of the upper electrode film 25, this protective film may have, for example, an opening through which the metal wiring film 26 is partially exposed.

(Operation)

Next, an operation example of the image pickup device 1 will be described. In the image pickup device 1, a predetermined level of voltage is applied to each pixel 12, for example, through the metal wiring film 26. When external light enters the pixel region 11 through an optical component such as a lens, part of the incident light is converted into electricity by the organic photoelectric conversion film 24, and electrical charge in the quantity according to the intensity of the incident light is built up in each pixel 12. This build-up charge is collected in each lower electrode film 23 by virtue of an electric field generated from the voltage applied to each pixel 12. Then, a voltage according to the level of the electrical charge built up in each lower electrode film 23 is read at a preset timing, and output as a pixel signal. Following this, the pixel signals are processed by the external signal processing circuit or any other processor, so that image data is generated.

(Effect)

Next, an effect of the image pickup device 1 will be described. In the image pickup device 1, the metal wiring film 26 that is electrically connected to the upper electrode film 25 coats the entire side of the organic photoelectric conversion film 24. The metal wiring film 26 used to drive the image pickup device 1 thereby suppresses moisture and gas from entering the interior of the organic photoelectric conversion film 24 through the side of the organic photoelectric conversion film 24. The organic photoelectric conversion film 24 could be distorted easily, in particular, in the vicinity of its side. Therefore, if the passivation film is provided on the entire upper surface including the upper surface of the upper electrode film 25, a part of the passivation film which is in the vicinity of the side of the organic photoelectric conversion film 24 may be cracked easily. In the first embodiment, however, even if the part of the passivation film which is in the vicinity of the side of the organic photoelectric conversion film 24 is cracked, it is possible to prevent an entry of moisture and gas through the crack. This is because the entire side of the organic photoelectric conversion film 24 is coated by the metal wiring film 26. Consequently, it is possible to prevent deterioration of the organic photoelectric conversion film 24.

In the image pickup device 1, the metal wiring film 26 is used for not only a voltage application path for the upper electrode film 25, but also the protection of the organic photoelectric conversion film 24. It is therefore possible to protect the organic photoelectric conversion film 24 without involving any additional process or member.

2. Modification

Next, modifications of the above image pickup device 1 in the first embodiment will be described.

First Modification

Figure 3:
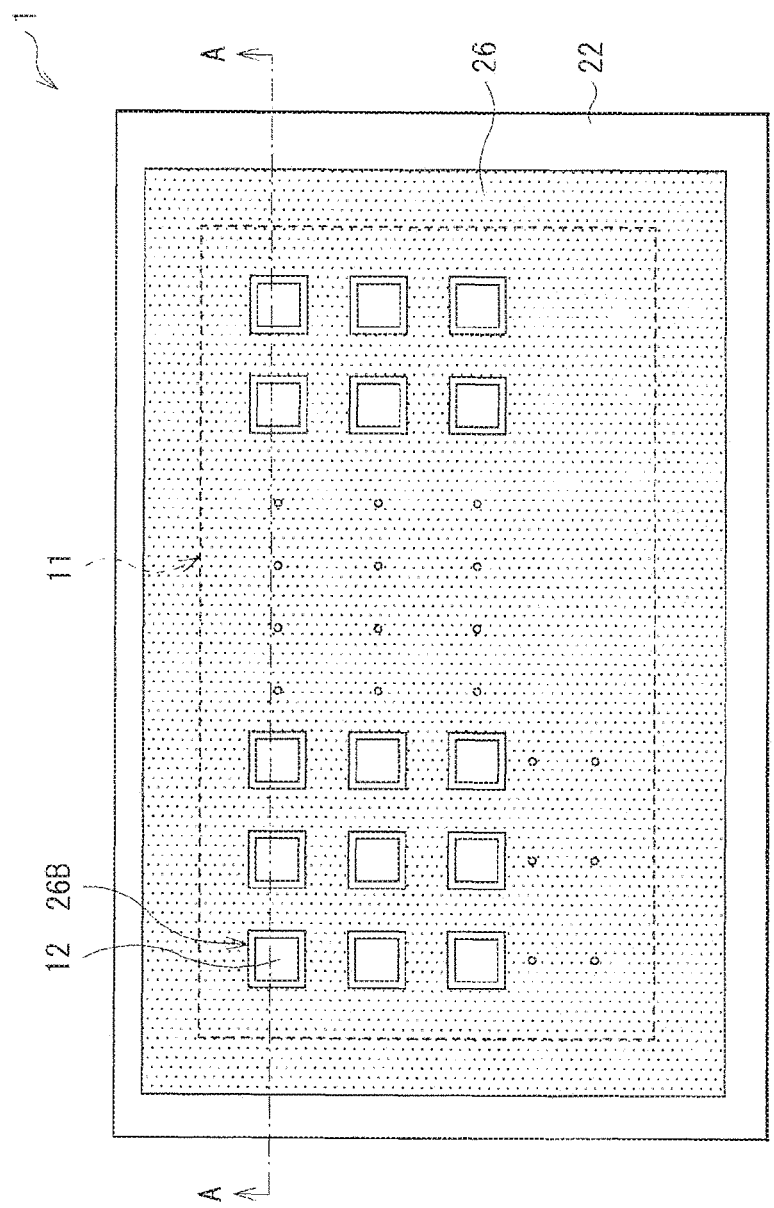
FIG. 3 is a view showing a upper-surface configuration example of an image pickup device according to a first modification.
Figure 4:
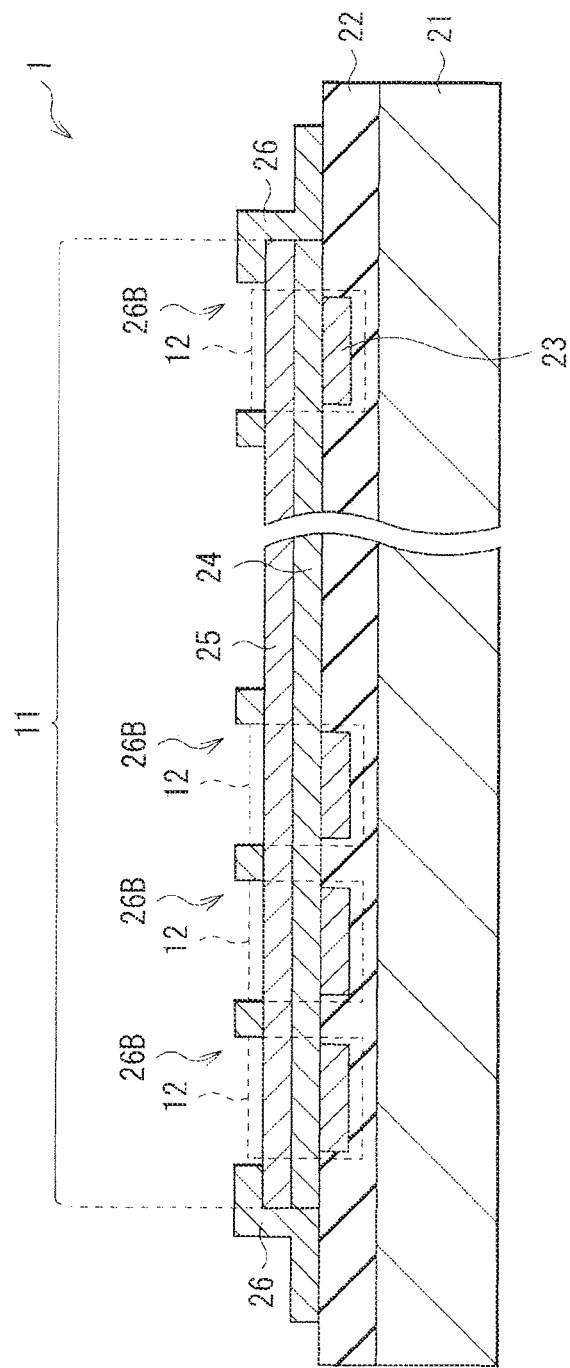
FIG. 4 is a view showing a cross-sectional configuration example as viewed from a direction of an A-A arrow in FIG. 3.

FIG. 3 shows an upper-surface configuration example of the image pickup device 1 according to a first modification; FIG. 4 shows a cross-sectional configuration example as viewed from a direction of an A-A arrow in FIG. 3. The metal wiring film 26 in the first embodiment is circular in shape with the single opening 26A, whereas the metal wiring film 26 in the first modification has, for example, openings 26B in the respective pixels 12 instead of the opening 26A, as shown in FIGS. 3 and 4. The metal wiring film 26 is thereby present in a gap between each adjacent pair of the pixels 12. As a result, it is possible to reserve windows for incident light, and to reduce an entry of moisture and gas to the interior of the organic photoelectric conversion film 24 through the upper surface of the organic photoelectric conversion film 24. Furthermore, it is possible to reduce a crosstalk between each adjacent pair of the pixels 12, due to a light shielding effect of the metal wiring film 26.

Second Modification

Figure 5:
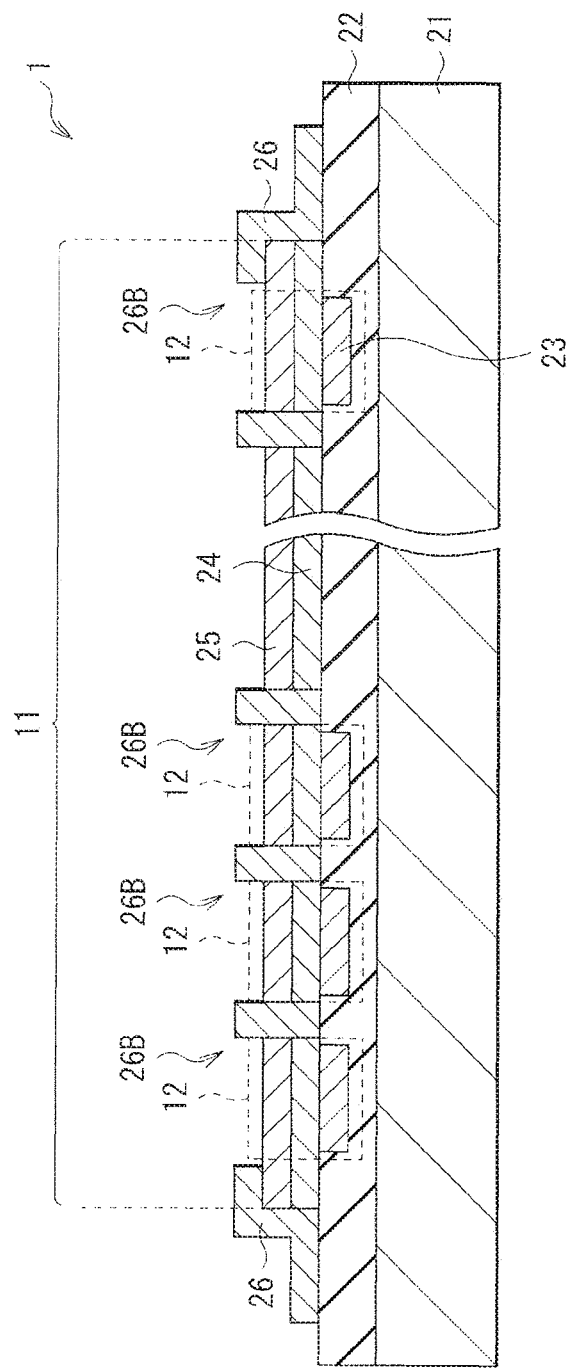
FIG. 5 is a view showing a cross-sectional configuration example of an image pickup device according to a second modification.

FIG. 5 shows a cross-sectional configuration example of the image pickup device 1 according to a second modification. More specifically, FIG. 5 shows a cross-sectional configuration example of an area taken along a line A-A in FIG. 3. In the above first modification, each of the organic photoelectric conversion film 24 and the upper electrode film 25 is a sheet-shaped film provided so as to be shared by all the pixels 12. In the second modification, each of the organic photoelectric conversion film 24 and the upper electrode film 25 is disposed in the respective pixels 12 while being separated from one another. Specifically, each of the organic photoelectric conversion film 24 and the upper electrode film 25 is formed of a plurality of island-shaped films provided in the corresponding pixel 12. Each adjacent pair of the pixels 12 are thereby isolated from each other by the metal wiring film 26. It is thus possible to reduce an entry of moisture and gas to the interior of the organic photoelectric conversion film 24 through the side of the organic photoelectric conversion film 24. Furthermore, it is possible to reduce a crosstalk between each adjacent pair of the pixels 12 due to a light shielding effect of the metal wiring film 26.

Third Modification

Figure 6:
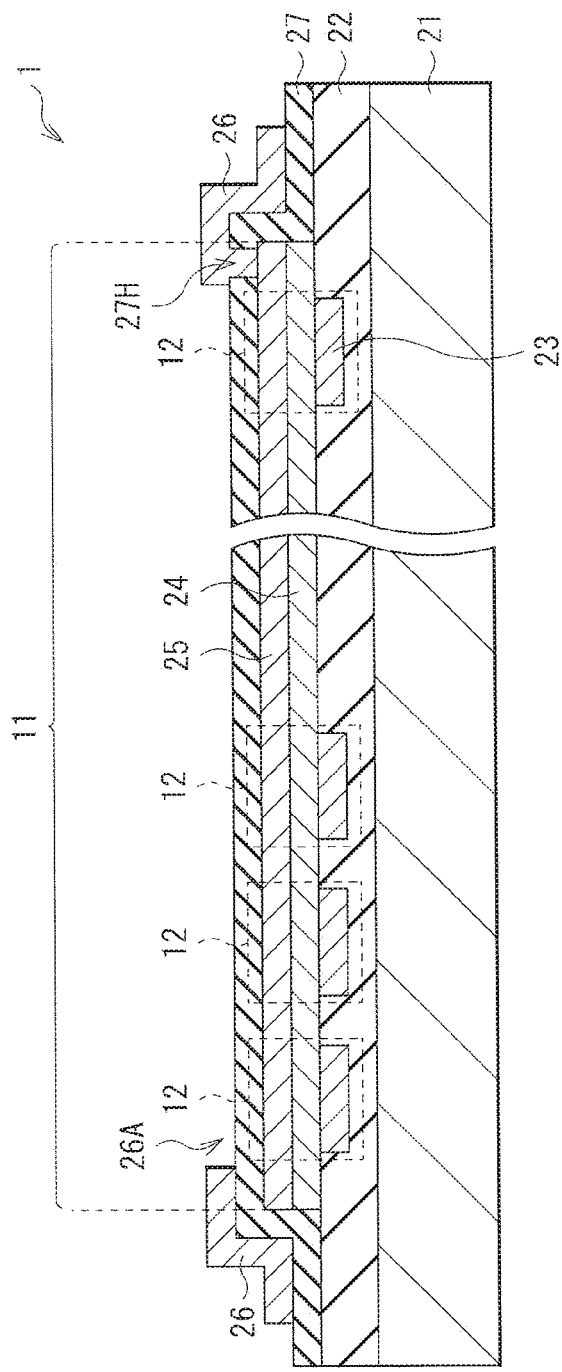
FIG. 6 is a view showing a cross-sectional configuration example of an image pickup device according to a third embodiment.
Figure 7:
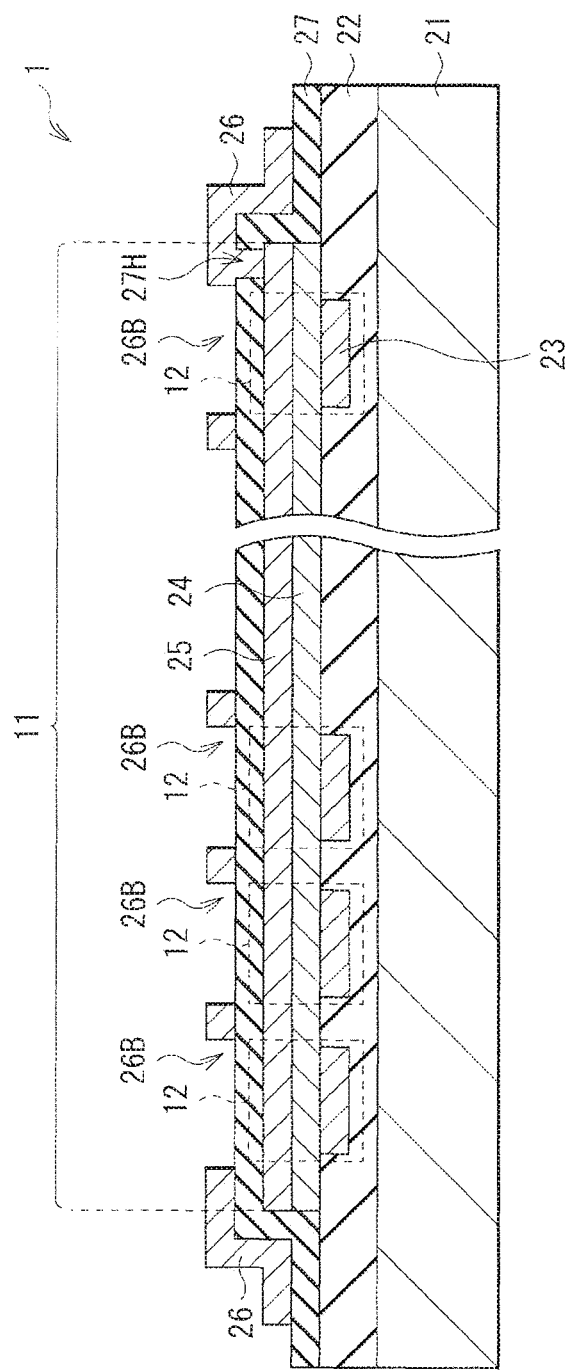
FIG. 7 is a view showing a cross-sectional configuration example of the image pickup device according to the third embodiment.
Figure 8:
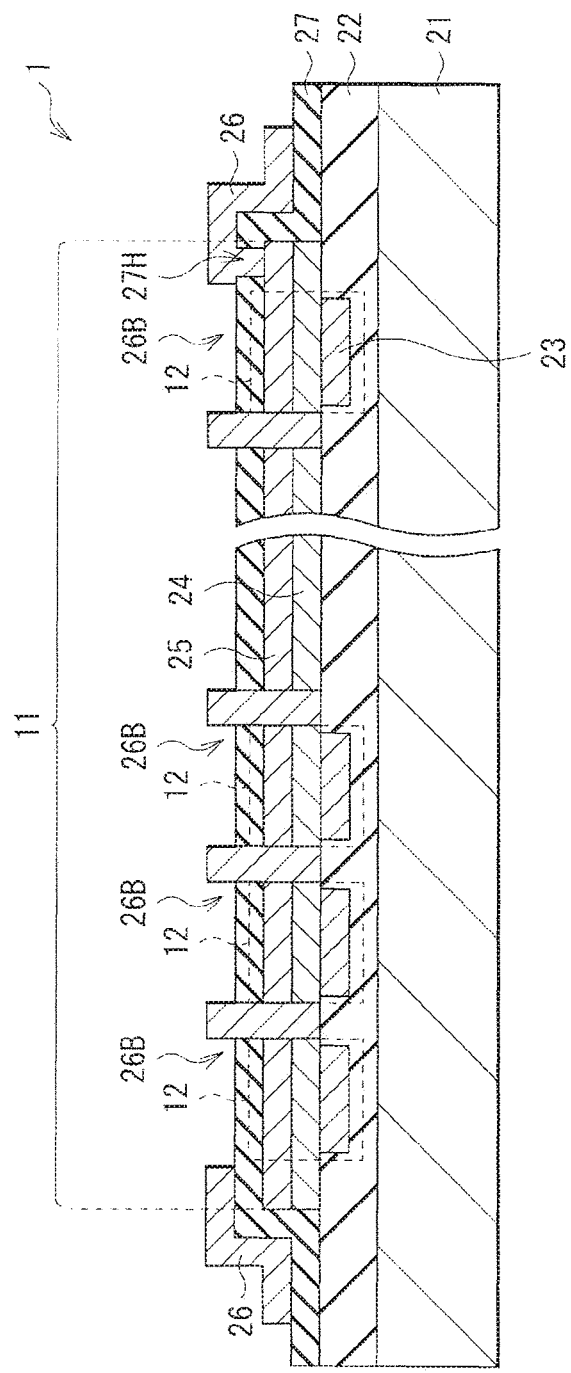
FIG. 8 is a view showing a cross-sectional configuration example of the image pickup device according to the third embodiment.

FIGS. 6 to 8 show cross-sectional configuration examples of the image pickup devices 1 according to a third modification. FIG. 6 shows a modification of the image pickup device 1 in the first embodiment. FIG. 7 shows a modification of the image pickup device 1 in the first modification. FIG. 8 shows a modification of the image pickup device 1 in the second modification.

Each of the image pickup devices 1 in the third modification is provided with a protective film 27 that coats both the organic photoelectric conversion film 24 and the upper electrode film 25. The protective film 27 is formed between the organic photoelectric conversion film 24 and the metal wiring film 26 and between the upper electrode film 25 and the metal wiring film 26. Each protective film 27 may be, for example, formed along the upper surface of the upper electrode film 25 and both the sides of the organic photoelectric conversion film 24 and the upper electrode film 25, as shown in FIGS. 6 to 8. In FIGS. 6 and 7, each protective film 27 is a sheet-shaped film provided so as to be shared by all the pixels 12, and formed in the whole of the pixel region 11. In FIG. 8, the protective film 27 is configured with a plurality of island-shaped films provided in the respective pixels 12 and a circular film on the periphery of the pixel region 11.

The protective film 27 reduces an entry of moisture and gas to the interior of the organic photoelectric conversion film 24 through the upper surface of the organic photoelectric conversion film 24. The protective film 27 may be, for example, a silicon nitride film, a silicon nitrogen oxide film, an aluminum oxide film, or a stacked film containing two or more of these films.

In each of FIGS. 6 to 8, the protective film 27 has one or more openings 27H positioned opposite the upper electrode film 25. Each opening 27H serves as a passage which the upper electrode film 25 makes contact with the metal wiring film 26. A part of the upper electrode film 25 is filled in each opening 27H, and the metal wiring film 26 makes contact with the upper electrode film 25 via the one or more openings 27H.

(Manufacturing Method)

Each of the image pickup devices 1 in the third modification may be manufactured by the following method. Thereinafter, a method of manufacturing the image pickup device 1 shown in FIG. 6 will be described; however the image pickup devices 1 shown in FIGS. 7 and 8 may also be manufactured by substantially the same method.

Figure 9A:
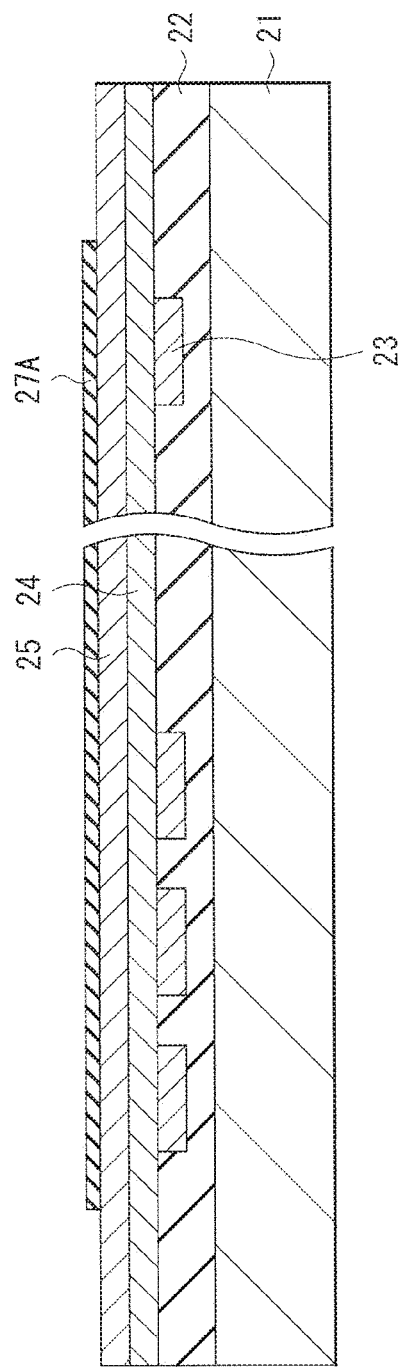
FIG. 9A is a view showing a manufacturing step example of the image pickup device in FIG. 6.
Figure 9B:
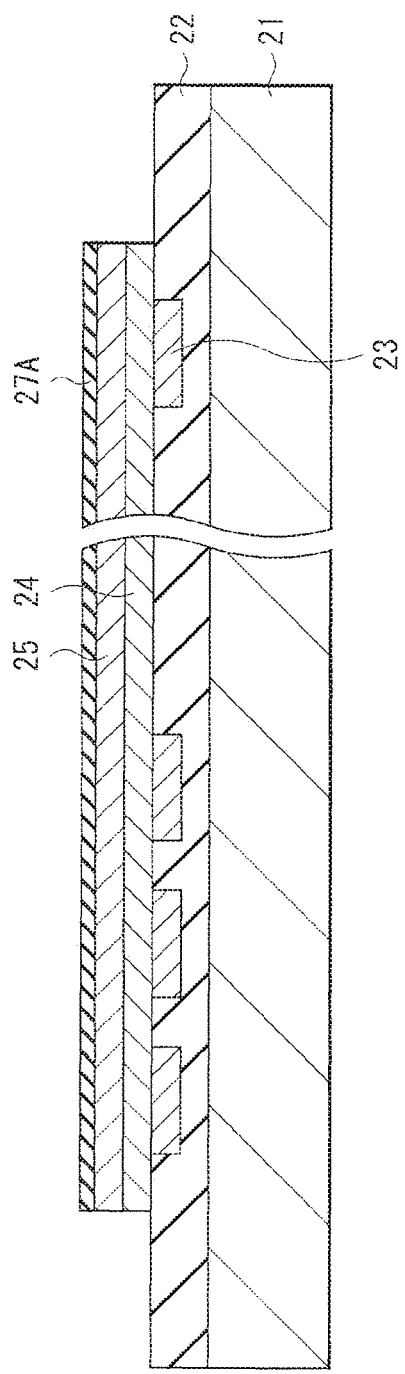
FIG. 9B is a view showing a manufacturing step example which follows that in FIG. 9A.

FIGS. 9A, 9B, 10A, and 10B show an example of method of manufacturing the image pickup device 1 shown in FIG. 6, in accordance with a process sequence. First, the insulating film 22, the lower electrode film 23, the organic photoelectric conversion film 24, and the upper electrode film 25 are formed on the substrate 21. Then, a protective film 27A is formed on the upper electrode film 25 at a preset location (FIG. 9A). The protective film 27A functions as a mask at the subsequent etching step. The protective film 27A may be formed, for example, only in a region that will become the pixel region 11 at a following step. The protective film 27A may be, for example, a silicon nitride film, a silicon nitrogen oxide film, an aluminum oxide film, or two or more of these films. Then, the organic photoelectric conversion film 24 and the upper electrode film 25 are selectively etched by using the protective film 27A as a mask (FIG. 9B). As a result, both the organic photoelectric conversion film 24 and the upper electrode film 25 are formed, for example, only in a region that will become the pixel region 11 at a following step.

Figure 10A:
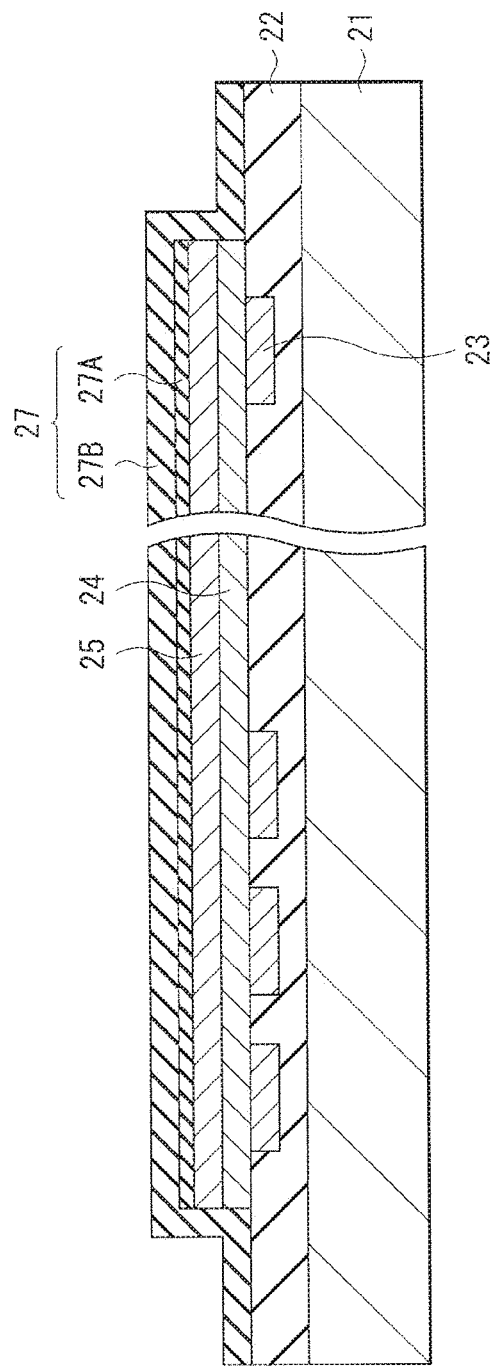
FIG. 10A is a view showing a manufacturing step example which follows that in FIG. 9B.

Next, a protective film 27B is formed on the whole of the upper surface including the protective film 27A while the protective film 27A is left (FIG. 10A). The protective film 27B may be, for example, a silicon nitride film, a silicon nitrogen oxide film, an aluminum oxide film, or a stacked film containing two or more of these films. A protective film formed of the protective films 27A and 27B corresponds to a specific example of the protective film 27. More specifically, the protective film 27 is formed of the protective film 27A that coats the upper surface of the upper electrode film 25, and the protective film 27B that coats both the organic photoelectric conversion film 24 and the protective film 27A.

Figure 10B:
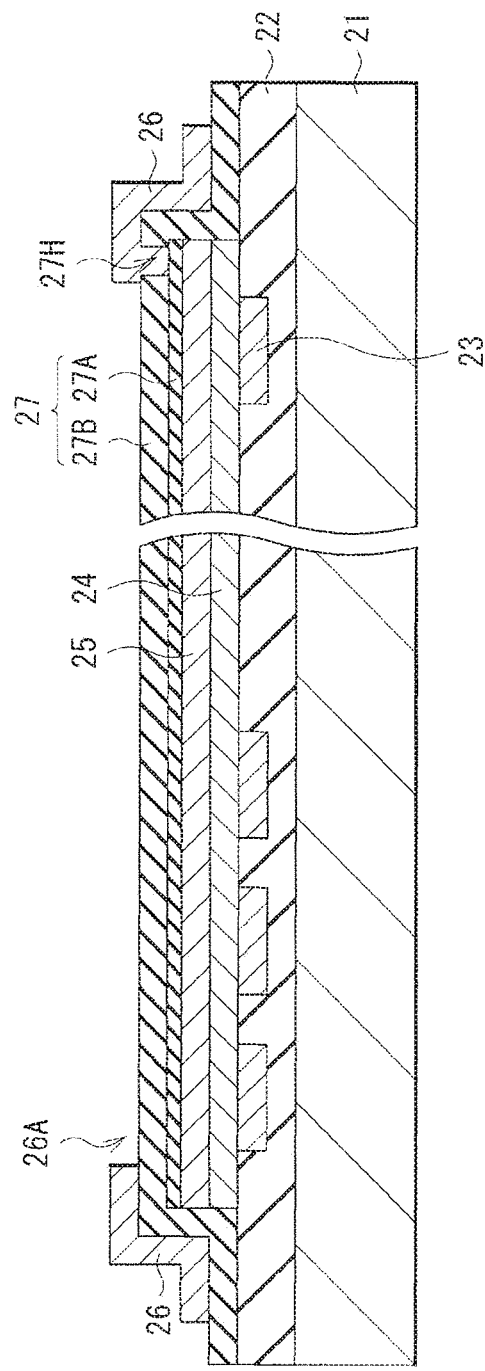
FIG. 10B is a view showing a manufacturing step example which follows that in FIG. 10A.
Figure 11:
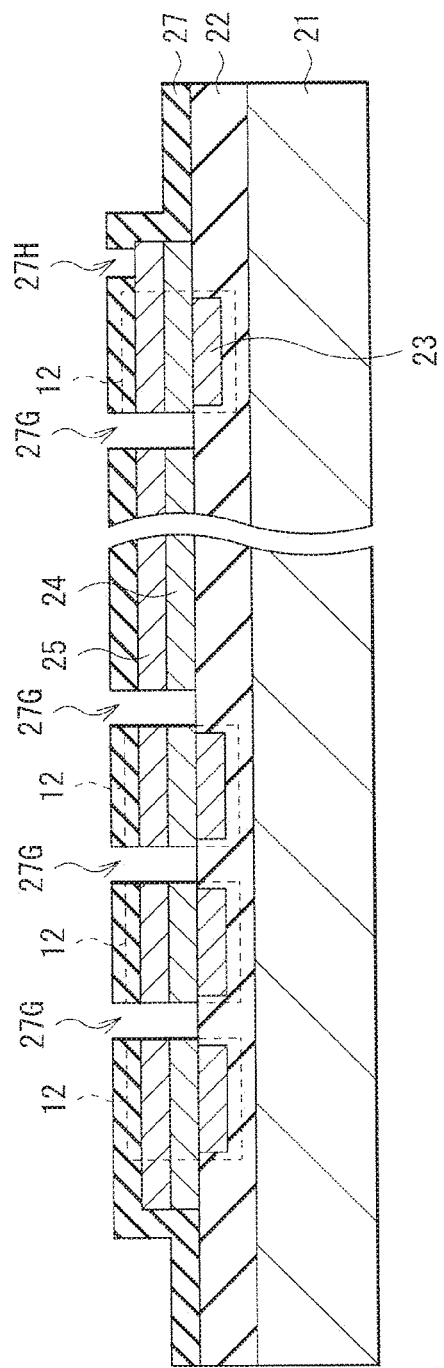
FIG. 11 is a view showing another manufacturing step example which follows that in FIG. 10A.

Subsequently, the one or more openings 27H are formed in the protective film 27 at preset locations, and then the metal wiring film 26 is formed so as to be embedded in the openings 27H and to coat both the entire sides of the organic photoelectric conversion film 24 and the upper electrode film 25 (FIG. 10B). After that, a passivation film may be formed on the whole of the upper surface including the upper surface of the upper electrode film 25 as necessary. Through the above steps, the image pickup device 1 shown in FIG. 6 is manufactured.

In a process for manufacturing the image pickup device 1 shown in FIG. 8, in order to form the one or more openings 27H in the protective film 27, a groove 27G is formed in a region that faces the gap between each adjacent pair of the lower electrode films 23 so as to pass through the protective film 27, the upper electrode film 25, and the organic photoelectric conversion film 24. Then, the metal wiring film 26 is formed so as to be embedded in the openings 27H and the grooves 27G and to coat both the entire sides of the organic photoelectric conversion film 24 and the upper electrode film 25. After that, a passivation film may be formed on the whole of the upper surface including the upper surface of the upper electrode film 25 as necessary. Through the above steps, the image pickup device 1 shown in FIG. 8 is manufactured.

Figure 12:
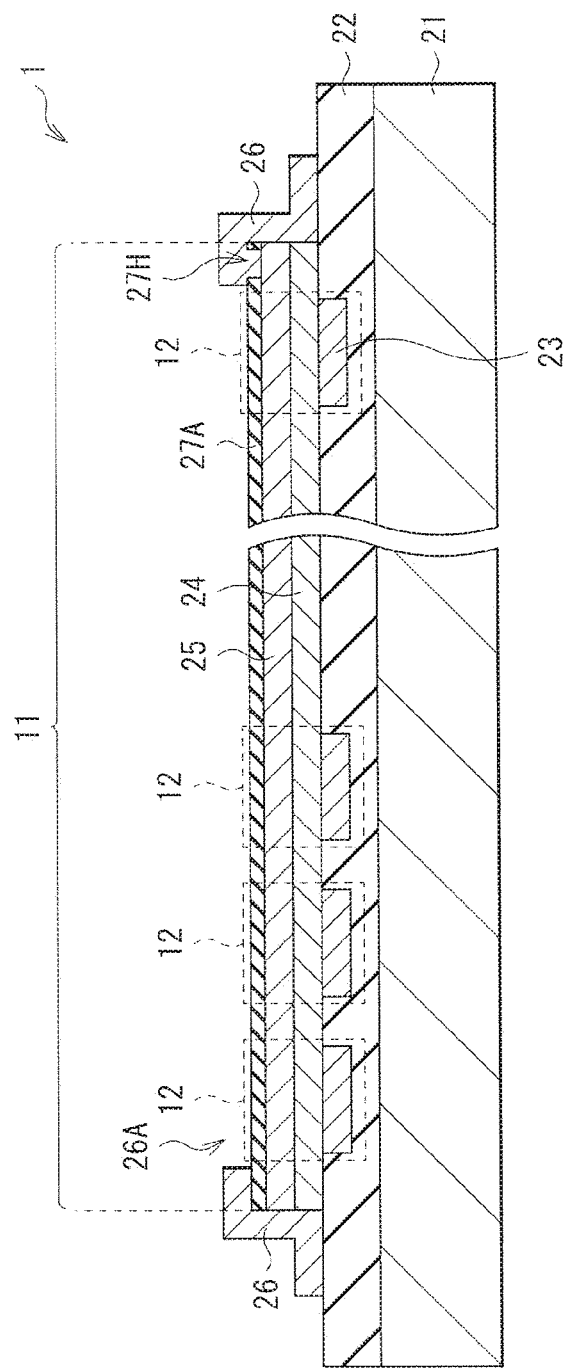
FIG. 12 is a view showing a cross-sectional configuration example of an image pickup device according to the third embodiment.

Note that in each of the methods of manufacturing the image pickup devices 1 in FIGS. 6, 7, and 8, the forming of the protective film 27B may be skipped. In this case, the image pickup devices 1 are obtained, in which the protective film 27A is provided only on the upper surface of the upper electrode film 25, and in which both the sides of the organic photoelectric conversion film 24 and the upper electrode film 25 are in contact with the metal wiring film 26, for example, as shown in FIG. 12.

In the third modification, the protective film 27 or 27A protects the organic photoelectric conversion film 24. This makes it possible to reduce an entry of moisture and gas to the interior of the organic photoelectric conversion film 24 through the upper surface of the organic photoelectric conversion film 24. The protective film 27A is also used as a mask when both the organic photoelectric conversion film 24 and the upper electrode film 25 are selectively etched. In other words, the protective film 27A also serves the purpose of mitigating an etching damage to the organic photoelectric conversion film 24. It is thus possible to use the protective film 27A to suppress deterioration of the organic photoelectric conversion film 24 which would be caused by etching damage.

In the third modification, the protective film 27A that has been used as an etching mask is left deliberately, and is reused as a protective film for the organic photoelectric conversion film 24. This makes it possible to provide a protective film (protective film 27A) for the organic photoelectric conversion film 24 without involving any additional process.

Fourth Modification

Figure 13:
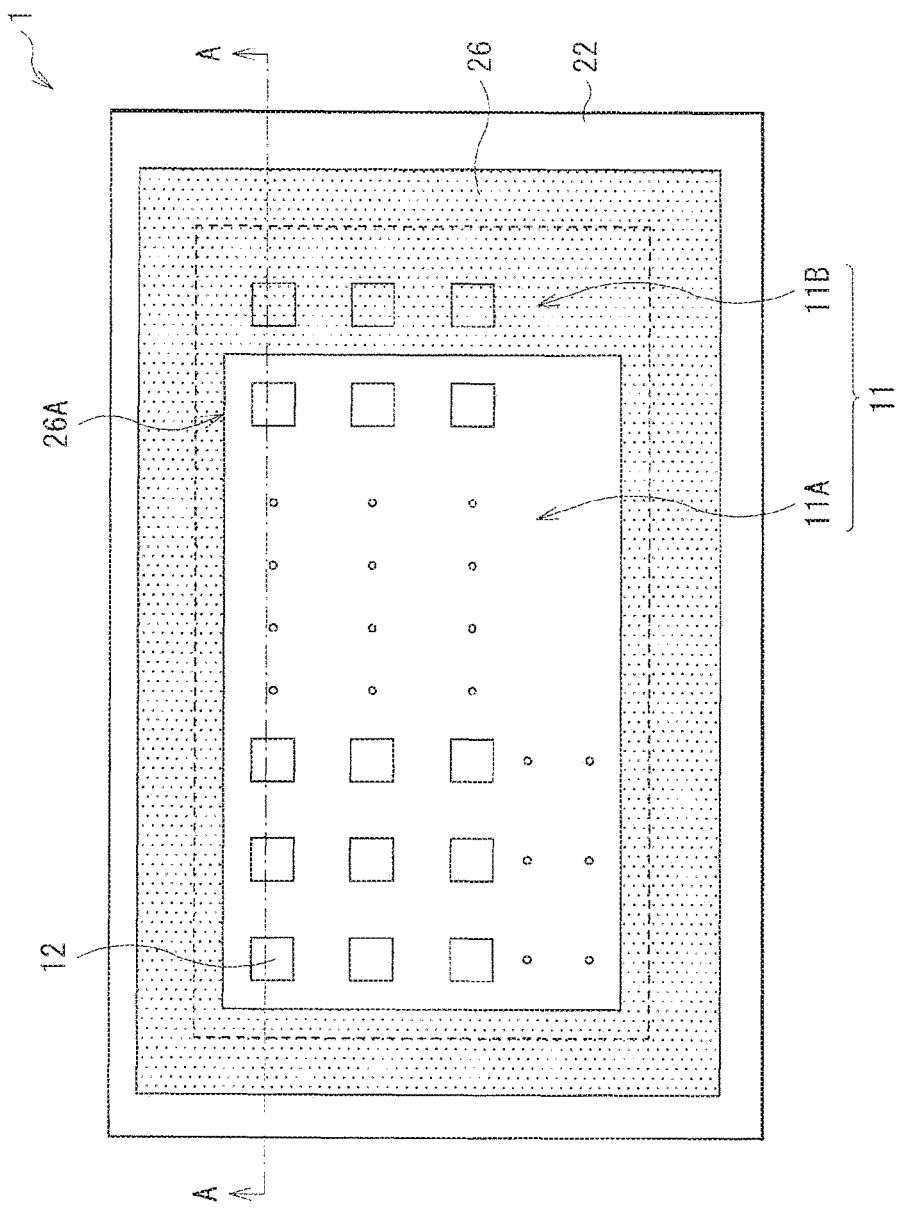
FIG. 13 is a view showing a upper-surface configuration example of an image pickup device according to a fourth modification.
Figure 14:
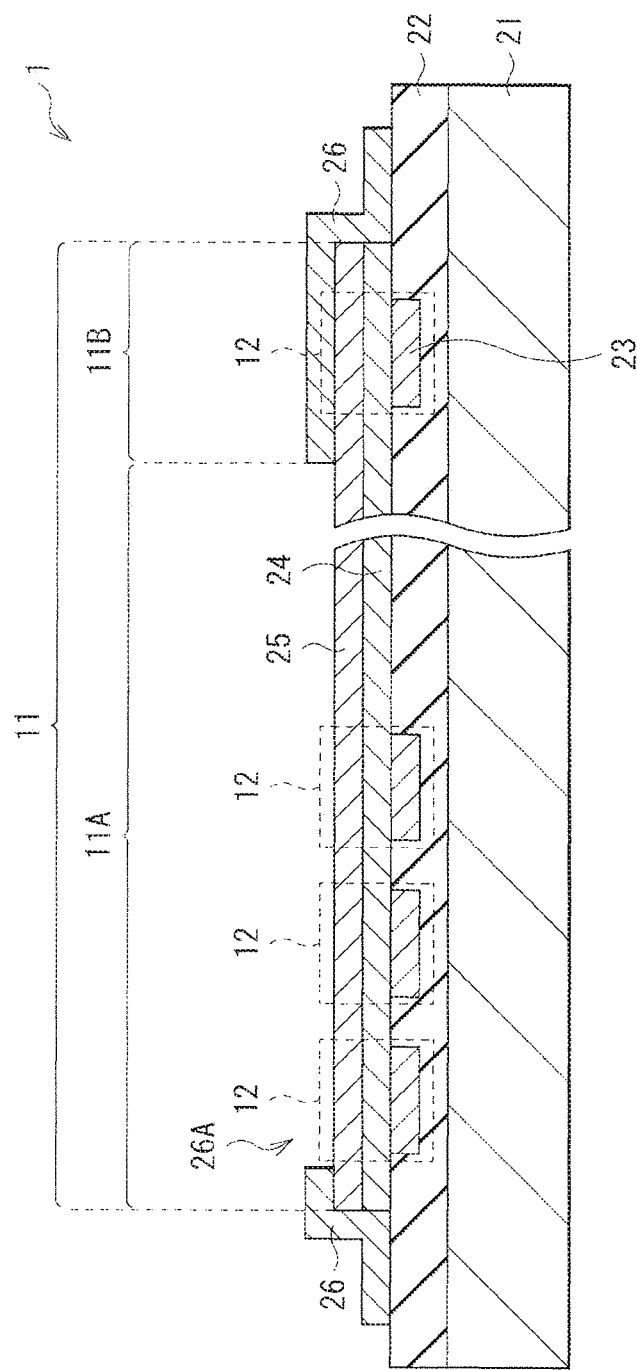
FIG. 14 is a view showing a cross-sectional configuration example as viewed from a direction of an A-A arrow in FIG. 13.
Figure 15:
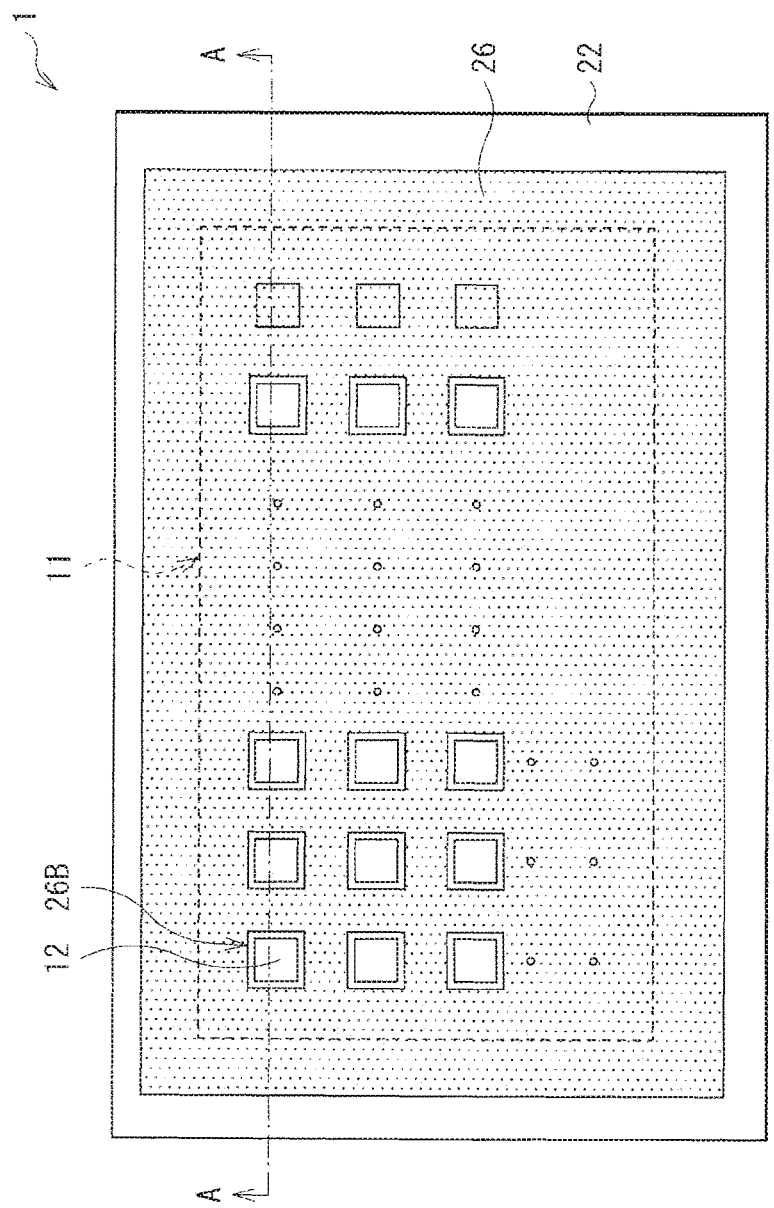
FIG. 15 is a view showing a upper-surface configuration example of the image pickup device according to the fourth modification.
Figure 16:
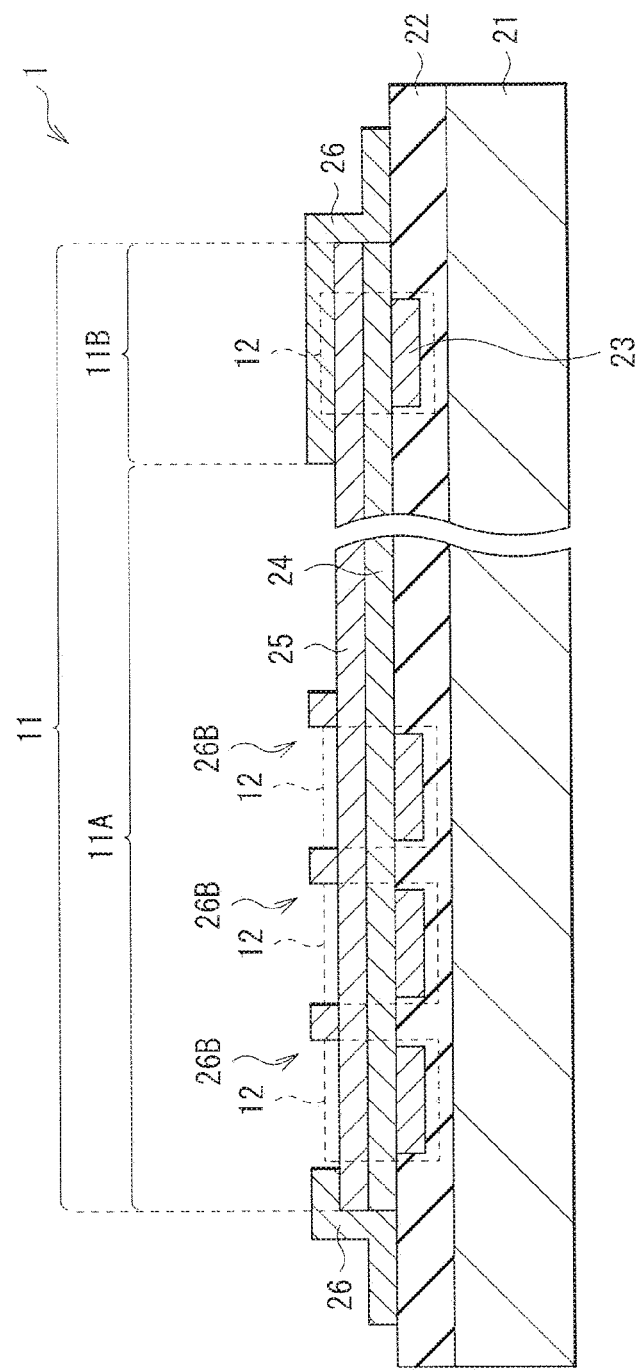
FIG. 16 is a view showing a cross-sectional configuration example as viewed from a direction of an A-A arrow in FIG. 15.
Figure 17:
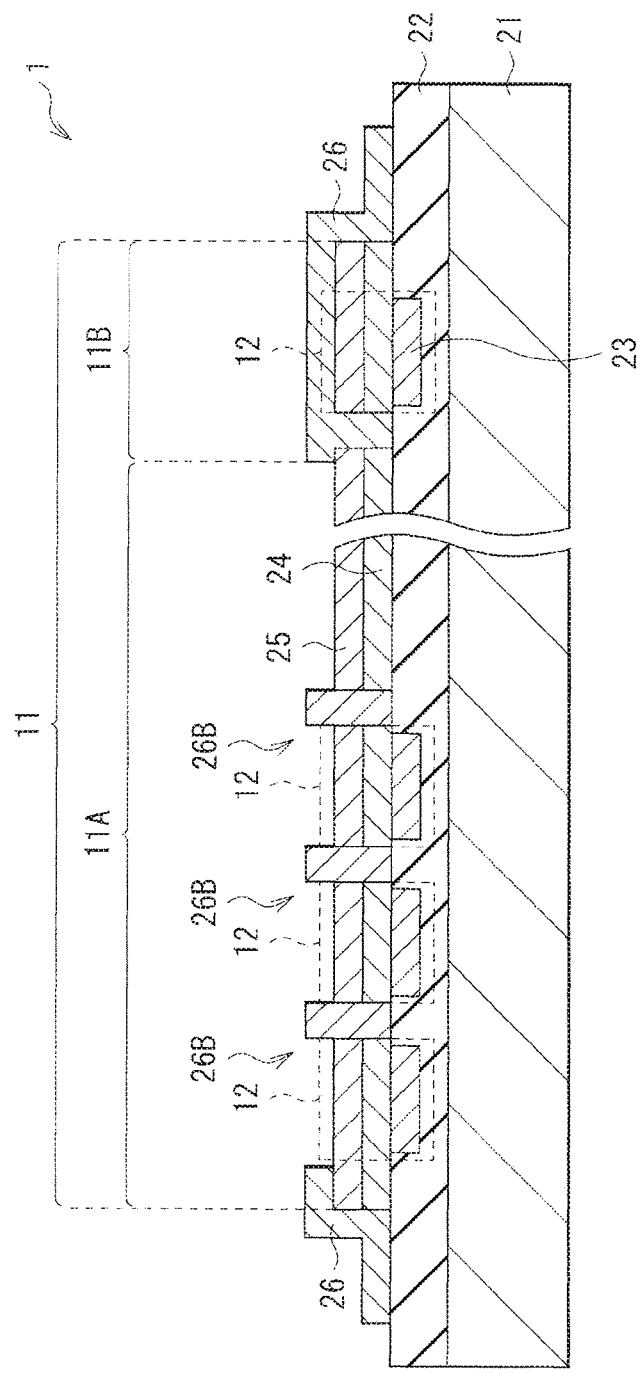
FIG. 17 is a view showing a cross-sectional configuration example of the image pickup device according to the fourth modification.
Figure 18:
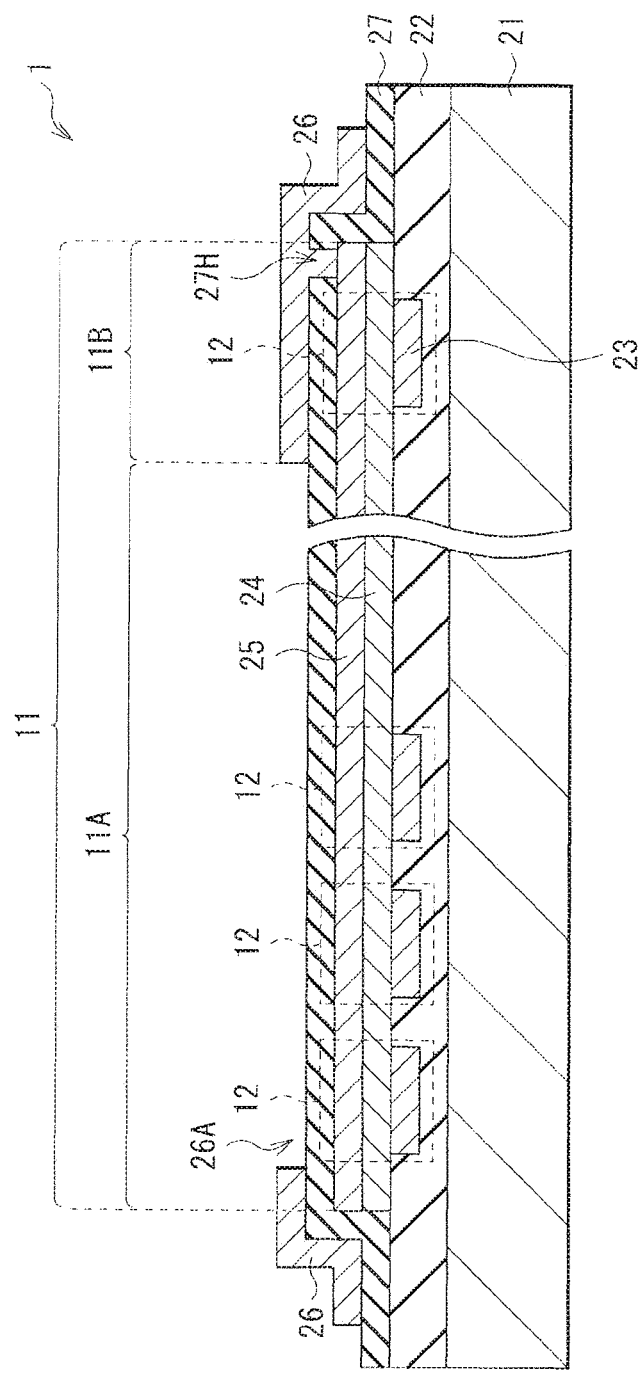
FIG. 18 is a view showing a cross-sectional configuration example of the image pickup device according to the fourth modification.
Figure 19:
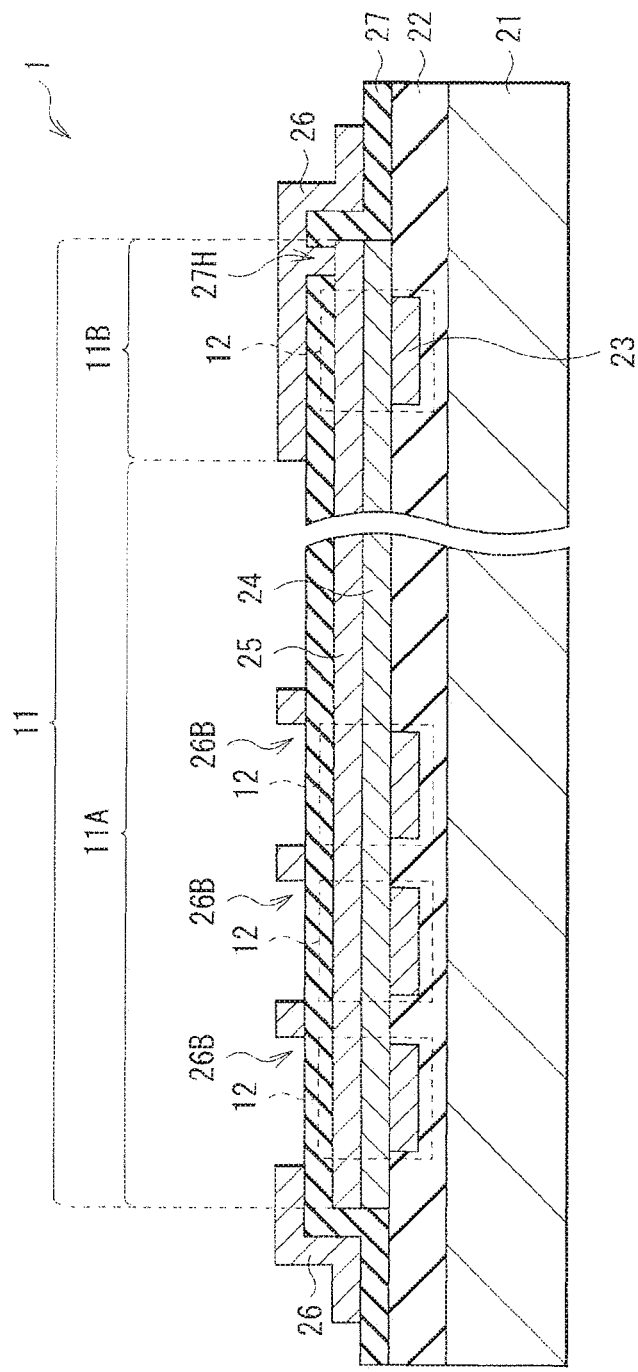
FIG. 19 is a view showing a cross-sectional configuration example of the image pickup device according to the fourth modification.
Figure 20:
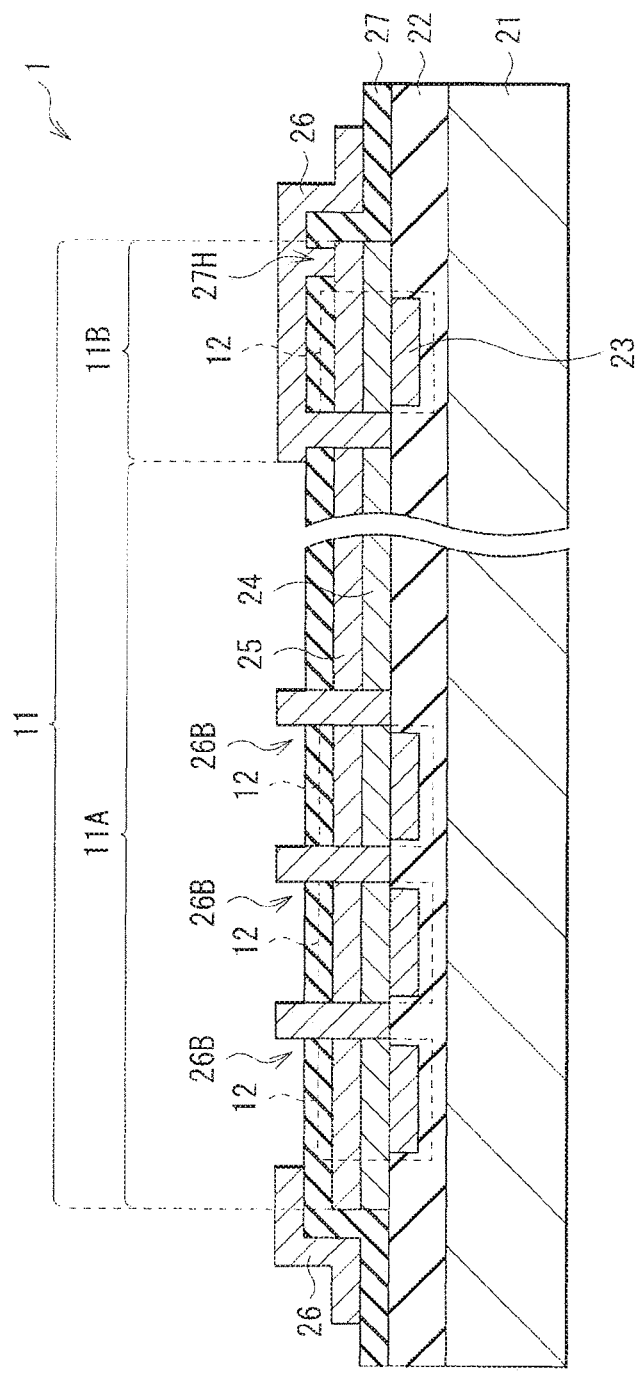
FIG. 20 is a view showing a cross-sectional configuration example of the image pickup device according to the fourth modification.

FIGS. 13 to 20 show examples of image pickup device 1 in a fourth modification. FIGS. 13 and 15 show upper-surface configuration examples of the image pickup devices 1 in the fourth modification. FIG. 14 shows a cross-sectional configuration example as viewed from a direction of an A-A arrow in FIG. 13. FIGS. 16 and 17 show cross-sectional configuration examples from a direction of an A-A arrow in FIG. 15. FIG. 18 shows a cross-sectional configuration example as viewed from a direction of the A-A arrow in FIG. 13. FIGS. 19 and 20 show cross-sectional configuration examples as viewed from a direction of an A-A arrow in FIG. 15.

The metal wiring films 26 in the first embodiment and first, second, and third embodiments are formed so as to avoid the pixels 12, whereas each of metal wiring films 26 in the fourth modification covers one or more of the pixels 12. The one or more pixels covered by each metal wiring film 26 are used to acquire a black-level pixel signal. Each metal wiring film 26 accordingly has the single opening 26A or the plurality of openings 26B in a region (image region 11A) facing all the pixels out of the plurality of pixels 12 which are used to receive light. In addition, each metal wiring film 26 covers a region (optical black region 11B) facing all the pixels 12 out of the plurality of pixels 12 which are used to acquire the black-level pixel signal.

Each metal wiring film 26 in the fourth embodiment is utilized as both a voltage application path for the upper electrode film 25 and a protective film for the organic photoelectric conversion film 24, as well as a light-shielding film used to acquire the black-level pixel signal. In this way, the metal wiring film 26 plays the three roles simultaneously. This enables enhancement of a performance and function of each image pickup device 1 without complicating its internal configuration.

Fifth Modification

Figure 21:
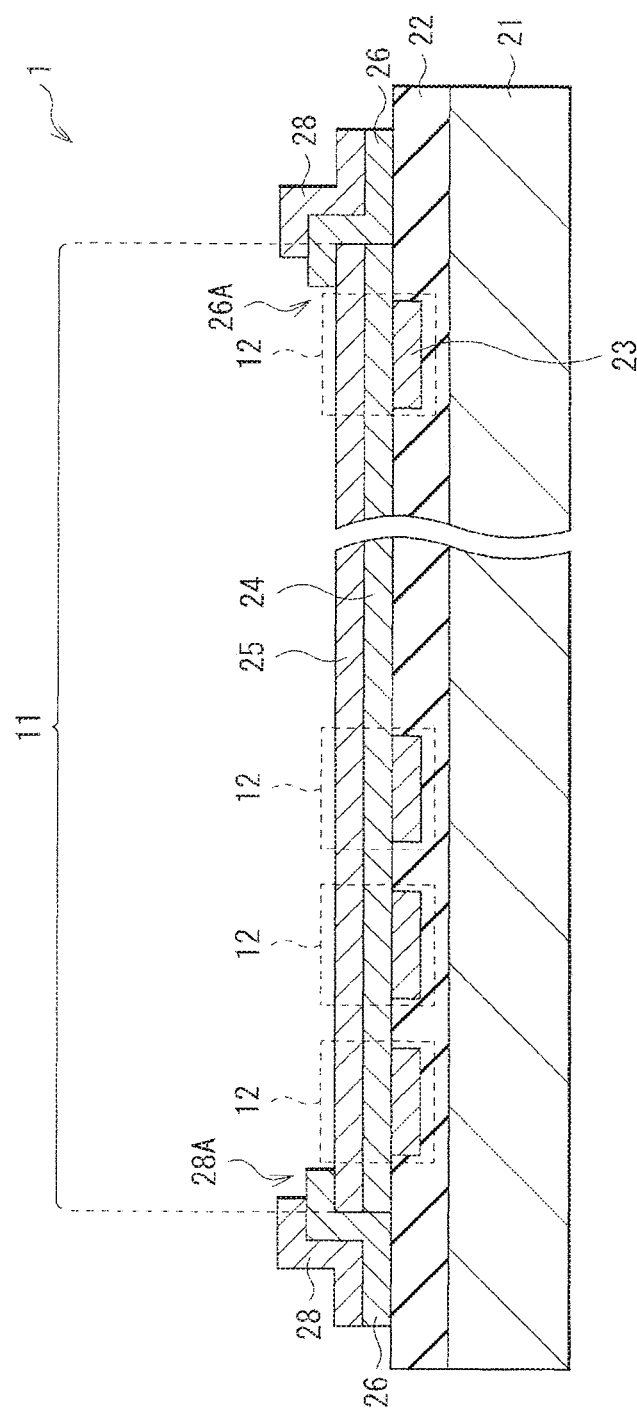
FIG. 21 is a view showing a cross-sectional configuration example of an image pickup device according to a fifth modification.
Figure 22:
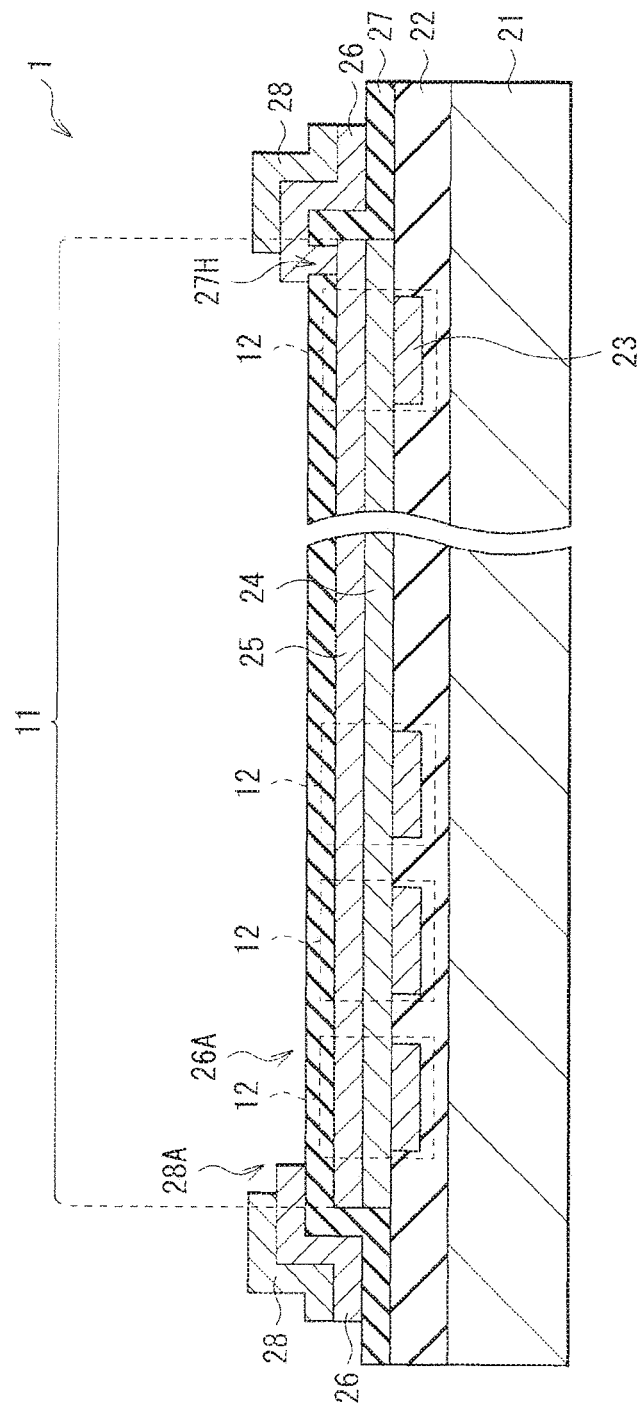
FIG. 22 is a view showing a cross-sectional configuration example of the image pickup device according to the fifth modification.
Figure 23:
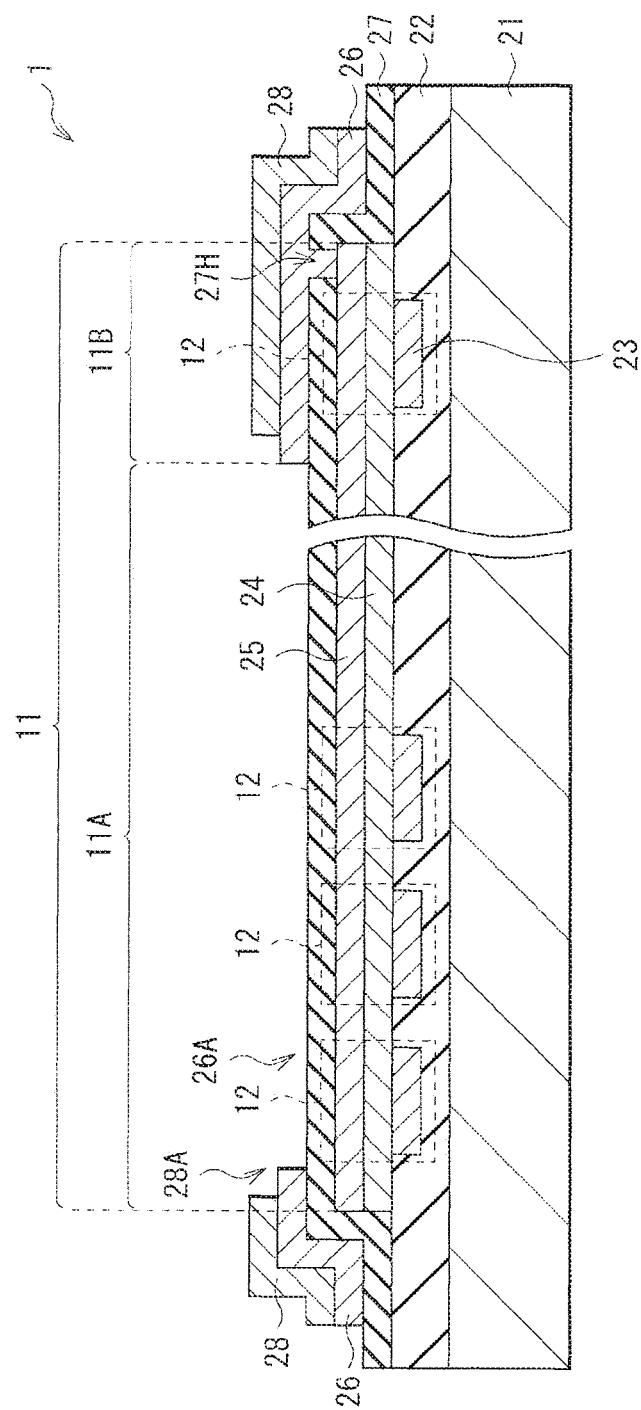
FIG. 23 is a view showing a cross-sectional configuration example of the image pickup device according to the fifth modification.

FIGS. 21 to 23 show examples of the image pickup device 1 in a fifth modification. FIGS. 21 to 23 show cross-sectional configuration examples of the image pickup devices 1 in the fifth modification.

The image pickup devices 1 in the fifth modification are configured by providing anti-flare films 28 on the upper surfaces of the metal wiring films 26 in the first embodiment, and first, second, third, and fourth modifications, respectively. Each anti-flare film 28 prevents incident light from being reflected on the upper surface of the metal wiring film 26. Each anti-flare film 28 may be made of, for example, a color filter film or a stacked film utilizing a multiple interference effect. In the fifth modification, providing the anti-flare film 28 on the upper surface of the metal wiring film 26 makes it possible to prevent the generation of a flare which would be caused by the reflection of incident light on the upper surface of the metal wiring film 26.

Sixth Modification

Figure 24:
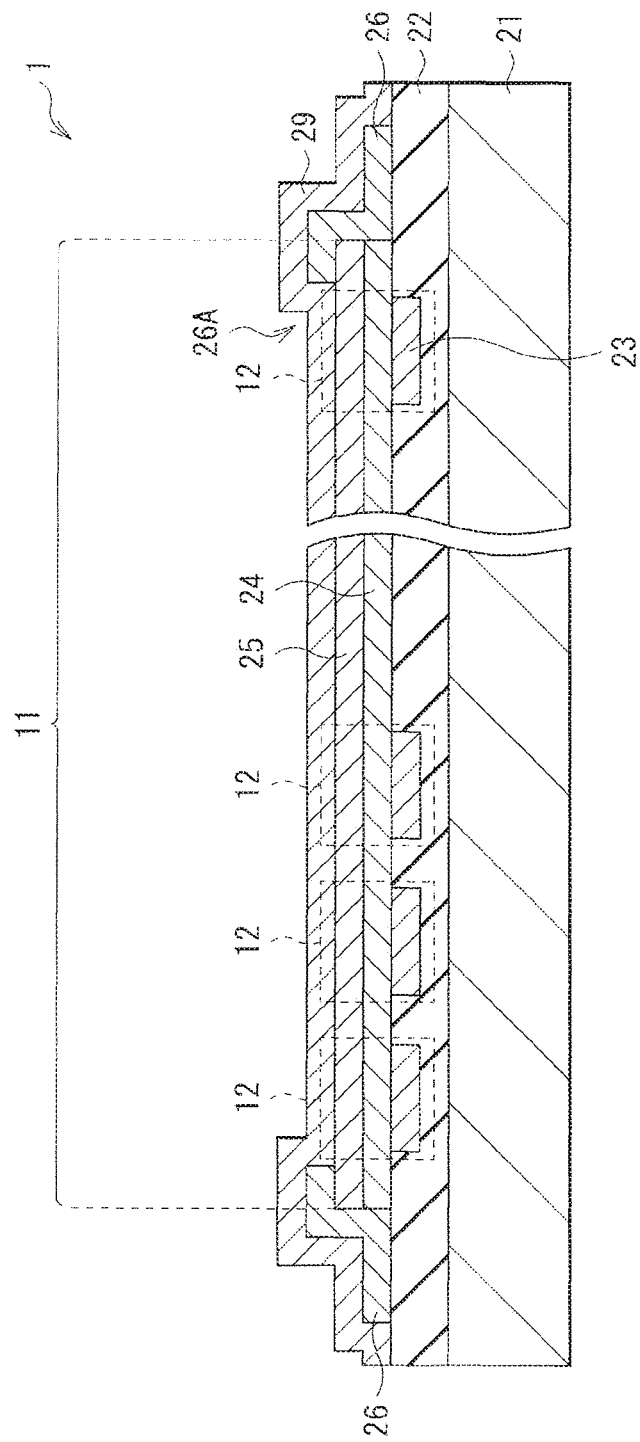
FIG. 24 is a view showing a cross-sectional configuration example of an image pickup device according to a sixth modification.

The image pickup device 1 in each of the first embodiment and first to fifth modifications may be provided with a passivation film on its entire upper surface including the upper surface of the upper electrode film 25 or the protective film 27. This passivation film protects the pixels 12, and may be made of, for example, a silicon nitride film, a silicon nitrogen oxide film, an aluminum oxide film, or a stacked film containing two or more of these films. The image pickup device 1 may be, for example, provided with a passivation film 29 on its entire upper surface including the upper surfaces of the upper electrode film 25 and the metal wiring film 26, as shown in FIG. 24. A material of the passivation film 29 may be substantially the same as that of the passivation film above.

Each image pickup device 1 may be provided with a color filter instead of or together with the passivation film. This color filter is positioned opposite the pixels 12, and selectively transmits externally incident light with a desired wavelength band. If the image pickup device 1 is provided with a protective film, such as a passivation film or a color filter, on the upper surface of the upper electrode film 25 or the protective film 27, this protective film may have an opening through which the metal wiring film 26 is partially exposed. The part of the metal wiring film 26 which is exposed through the opening serves as a pad electrode that electrically connects the metal wiring film 26 to an external circuit.

In the sixth modification, the passivation film is provided on the whole of the upper surface including the upper surface of the upper electrode film 25. This suppresses moisture and gas from entering the interior of the organic photoelectric conversion film 24 through the upper surface of the organic photoelectric conversion film 24. Consequently, it is possible to suppress deterioration of the organic photoelectric conversion film 24.

2. Second Embodiment

Figure 25:
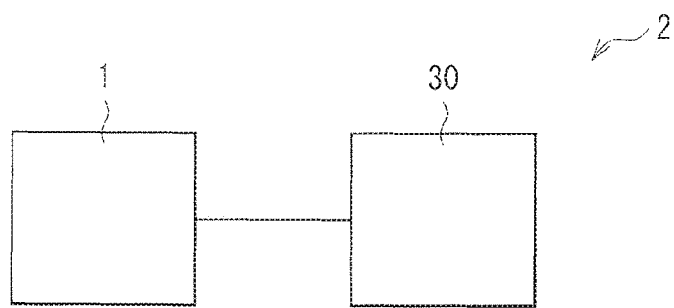
FIG. 25 is a view showing a schematic configuration example of an image pickup module according to a second embodiment of the present technology.

FIG. 25 shows a schematic configuration example of an image pickup module 2 according to a second embodiment of the present technology. Components of the image pickup module 2 may be the image pickup device 1 in one of the first embodiment and its modifications, and a signal processing circuit 30 that subjects the pixel signal output from the image pickup device 1 to a predetermined process. The image pickup device 1 and the signal processing circuit 30 are mounted, for example, on a single wiring substrate. The signal processing circuit 30 may include, for example, a digital signal processor (DSP).

The image pickup module 2 in the second embodiment is equipped with the image pickup device 1 in one of the first embodiment and its modifications. It is therefore possible to provide the image pickup module 2 with decreased aged deterioration of an image quality.

3. Third Embodiment

Figure 26:
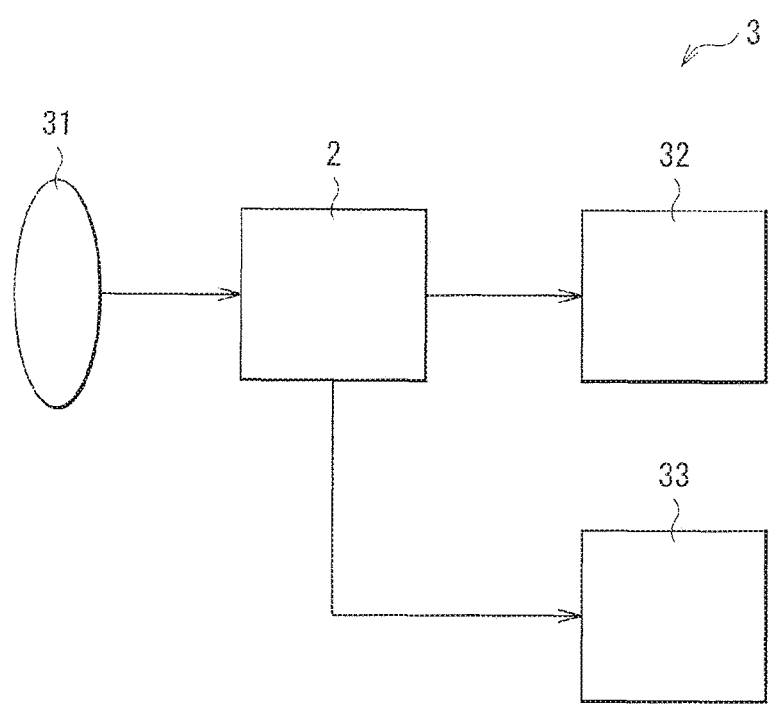
FIG. 26 is a view showing a schematic configuration example of an electronic apparatus according to a third embodiment of the present technology.

FIG. 26 shows a schematic configuration example of an electronic apparatus 3 according to a third embodiment of the present technology. Components of the electronic apparatus 3 may be the above image pickup module 2 in the second embodiment, a lens 31, a display unit 32, and a storage unit 33. The lens 31 causes external light to enter the image pickup device 1 in the image pickup module 2. The display unit 32 displays an output from the image pickup module 2 as an image. The storage unit 33 stores the output from the image pickup module 2. However, the electronic apparatus 3 does not necessarily have to be provided with the storage unit 33. In this case, the electronic apparatus 3 may be provided with a write unit that writes information onto an external storage unit.

The electronic apparatus 3 in the third embodiment is equipped with the above image pickup module 2 in the second embodiment. This makes it possible to provide an image pickup module 2 with decreased aged deterioration of an image quality.

Up to this point, the embodiments and their modifications of the present technology have been described; however there is no limitation on the embodiments and the like of the present technology, and various modifications and variations are possible.

Note that an embodiment of the present technology may also include the following configuration.

It is possible to achieve at least the following configurations from the above-described example embodiments of the disclosure.

(1) An image pickup device including:
a first electrode film;
an organic photoelectric conversion film;
a second electrode film; and
a metal wiring film electrically connected to the second electrode film,
the first electrode film, the organic photoelectric conversion film, and the second electrode film all provided on a substrate in this order, and
the metal wiring film coating an entire side of the organic photoelectric conversion film.

(2) The image pickup device according to (1), wherein
the metal wiring film is made of W, Al, Ti, Mo, Ta, Cu, an alloy containing one or more thereof, or a material containing one or more thereof and Si.

(3) The image pickup device according to (1) or (2), further including a protective film coating the organic photoelectric conversion film and the second electrode film, the protective film formed between the organic photoelectric conversion film and the metal wiring film.

(4) The image pickup device according to (3), wherein
the protective film is a silicon nitride film, a silicon nitrogen oxide film, an aluminum oxide film, or a stacked film containing two or more thereof.

(5) The image pickup device according to (3) or (4), wherein
the protective film includes a first protective film and second protective film, the first protective film coating an upper surface of the second electrode film, the second protective film coating the organic photoelectric conversion film and the first protective film.

(6) The image pickup device according to any one of (3) to (5), wherein
the protective film has one or more openings positioned opposite the second electrode film, and
the metal wiring film makes contact with the second electrode film via the one or more openings.

(7) The image pickup device according to any one of (1) to (6), wherein
the first electrode film includes a plurality of pixel electrodes provided in respective pixels,
the organic photoelectric conversion film is a sheet-shaped film provided to be shared by all the pixels, and
the metal wiring film coats an entire side of the sheet-shaped film.

(8) The image pickup device according to any one of (1) to (6), wherein
the first electrode film includes a plurality of pixel electrodes provided in respective pixels,
the organic photoelectric conversion film includes a plurality of island-shaped films provided in the respective pixels, and
the metal wiring film coats an entire side of each of the island-shaped films.

(9) An electronic apparatus including:
an image pickup device; and
a signal processing circuit subjecting a pixel signal output from the image pickup device to a predetermined process,
the image pickup device including a first electrode film, an organic photoelectric conversion film, and a second electrode film which are all provided on a substrate in this order, and a metal wiring film electrically connected to the second electrode film, the metal wiring film coating an entire side of the organic photoelectric conversion film.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup device comprising:
a first electrode film;
an organic photoelectric conversion film;
a second electrode film; and
a metal wiring film electrically connected to the second electrode film,
the first electrode film, the organic photoelectric conversion film, and the second electrode film all provided on a substrate in this order, and
the metal wiring film coating an entire side of the organic photoelectric conversion film.

2. The image pickup device according to claim 1, wherein the metal wiring film is made of W, Al, Ti, Mo, Ta, Cu, an alloy containing one or more thereof, or a material containing one or more thereof and Si.

3. The image pickup device according to claim 2, further comprising a protective film coating the organic photoelectric conversion film and the second electrode film, the protective film formed between the organic photoelectric conversion film and the metal wiring film.

4. The image pickup device according to claim 3, wherein the protective film is a silicon nitride film, a silicon nitrogen oxide film, an aluminum oxide film, or a stacked film containing two or more thereof.

5. The image pickup device according to claim 3, wherein the protective film includes a first protective film and second protective film, the first protective film coating an upper surface of the second electrode film, the second protective film coating the organic photoelectric conversion film and the first protective film.

6. The image pickup device according to claim 3, wherein the protective film has one or more openings positioned opposite the second electrode film, and
the metal wiring film makes contact with the second electrode film via the one or more openings.

7. The image pickup device according to claim 3, wherein the first electrode film includes a plurality of pixel electrodes provided in respective pixels,
the organic photoelectric conversion film is a sheet-shaped film provided to be shared by all the pixels, and
the metal wiring film coats an entire side of the sheet-shaped film.

8. The image pickup device according to claim 3, wherein the first electrode film includes a plurality of pixel electrodes provided in respective pixels,
the organic photoelectric conversion film includes a plurality of island-shaped films provided in the respective pixels, and
the metal wiring film coats an entire side of each of the island-shaped films.

9. An electronic apparatus comprising:
an image pickup device; and
a signal processing circuit subjecting a pixel signal output from the image pickup device to a predetermined process,
the image pickup device including a first electrode film, an organic photoelectric conversion film, and a second electrode film which are all provided on a substrate in this order, and a metal wiring film electrically connected to the second electrode film, the metal wiring film coating an entire side of the organic photoelectric conversion film.

* * * * *